(12) United States Patent
Horiguchi et al.

(10) Patent No.: US 8,858,754 B2
(45) Date of Patent: Oct. 14, 2014

(54) PLASMA PROCESSING APPARATUS

(75) Inventors: Masato Horiguchi, Nirasaki (JP);
Hiroshi Tsujimoto, Nirasaki (JP);
Takashi Kitazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 594 days.

(21) Appl. No.: 13/114,101

(22) Filed: May 24, 2011

(65) Prior Publication Data

US 2011/0290419 A1 Dec. 1, 2011

Related U.S. Application Data

(60) Provisional application No. 61/354,281, filed on Jun. 14, 2010.

(30) Foreign Application Priority Data

May 25, 2010 (JP) ................................. 2010-119547

(51) Int. Cl.

| C23C 16/509 | (2006.01) |
|---|---|
| C23C 16/455 | (2006.01) |
| H01L 21/306 | (2006.01) |
| C23F 1/00 | (2006.01) |
| H01J 37/32 | (2006.01) |
| C23C 16/06 | (2006.01) |
| C23C 16/22 | (2006.01) |

(52) U.S. Cl.
CPC ..... *H01J 37/32633* (2013.01); *H01J 37/32477* (2013.01); *H01J 37/32449* (2013.01); *H01J 37/3244* (2013.01); *H01J 37/32568* (2013.01); *C23C 16/45565* (2013.01); *H01J 37/32651* (2013.01); *H01J 37/32834* (2013.01)
USPC ............ 156/345.45; 156/345.43; 156/345.44; 156/345.33; 156/345.34; 118/723 E

(58) Field of Classification Search
USPC .......... 118/723 E, 723 R; 156/345.43–345.47
See application file for complete search history.

(56) References Cited

U.S. PATENT DOCUMENTS 3,215,508 A * 11/1965 Piester ........................... 422/143
4,931,135 A * 6/1990 Horiuchi et al. ................. 216/67
(Continued)

FOREIGN PATENT DOCUMENTS

| JP | 62-089330 A | 4/1987 |
| JP | 02-046723 A | 2/1990 |

(Continued)

OTHER PUBLICATIONS

Bouchoule, et al., Particle Generation and Behavior in a Silane-argon Low-pressure Discharge Under Continuous or Pulsed radio-frequency Excitation, Aug. 15, 1991, 70, No. 4.

*Primary Examiner* — Rudy Zervigon
(74) *Attorney, Agent, or Firm* — Pearne & Gordon LLP

(57) ABSTRACT

There is provided a plasma processing apparatus capable of easily exhausting a processing gas introduced in a space above a vertically movable upper electrode. The plasma processing apparatus includes a vertically movable upper electrode 120 installed at a ceiling wall 105 of a processing chamber 102 so as to face a lower electrode 111 and having a multiple number of discharge holes 123 for introducing the processing gas; a shield sidewall 310 configured to surround the electrodes and a processing space between the electrodes; an inner gas exhaust path 330 formed at the inside of the shield sidewall and configured to exhaust the atmosphere in the processing space; and an outer gas exhaust path 138 installed at the outside of the shield sidewall and configured to exhaust the processing gas introduced into a space between the upper electrode and the ceiling wall.

2 Claims, 8 Drawing Sheets

(56) References Cited

U.S. PATENT DOCUMENTS

| | | | | |
|---|---|---|---|---|
| 5,009,738 A * | 4/1991 | Gruenwald et al. | ...... | 156/345.47 |
| 5,084,125 A * | 1/1992 | Aoi | ............ | 156/345.31 |
| 5,102,523 A * | 4/1992 | Beisswenger et al. | ... | 204/298.33 |
| 5,232,508 A * | 8/1993 | Arena et al. | .................. | 118/719 |
| 5,238,532 A * | 8/1993 | Zarowin et al. | .................. | 216/67 |
| 5,292,400 A * | 3/1994 | Mumola | ........................ | 216/71 |
| 5,342,471 A * | 8/1994 | Fukasawa et al. | ........ | 156/345.47 |
| 5,372,674 A * | 12/1994 | Steinberg | ........................ | 216/17 |
| 5,376,224 A * | 12/1994 | Zarowin | ........................ | 216/66 |
| 5,536,324 A * | 7/1996 | Fuchita | ........................ | 118/726 |
| 5,695,564 A * | 12/1997 | Imahashi | ...................... | 118/719 |
| 5,919,332 A * | 7/1999 | Koshiishi et al. | ......... | 156/345.47 |
| 6,312,526 B1 * | 11/2001 | Yamamuka et al. | ........ | 118/720 |
| 6,490,994 B1 * | 12/2002 | Yoshizawa | ............... | 118/723 ER |
| 6,508,199 B1 * | 1/2003 | Oyabu | ........................ | 118/723 E |
| 6,514,348 B2 * | 2/2003 | Miyamoto | .................... | 118/715 |
| 6,527,911 B1 * | 3/2003 | Yen et al. | .................. | 156/345.43 |
| 6,638,880 B2 * | 10/2003 | Yamamuka et al. | ........... | 438/758 |
| 6,664,496 B2 * | 12/2003 | Watabe et al. | ............ | 219/121.43 |
| 6,726,801 B2 * | 4/2004 | Ahn | ........................ | 156/345.29 |
| 6,910,441 B2 * | 6/2005 | Jang | ........................... | 118/723 R |
| 7,009,281 B2 * | 3/2006 | Bailey et al. | ................. | 257/642 |
| 7,255,773 B2 * | 8/2007 | Ogasawara et al. | ....... | 156/345.29 |
| 7,318,879 B2 * | 1/2008 | Kwon et al. | ............. | 156/345.47 |
| 7,708,834 B2 * | 5/2010 | Horimizu | ...................... | 118/715 |
| 7,807,222 B2 * | 10/2010 | Kuznetsov | ............... | 427/249.15 |
| 7,811,945 B2 * | 10/2010 | Sasaki | .......................... | 438/771 |
| 7,815,767 B2 * | 10/2010 | Sato | ........................... | 156/345.47 |
| 7,820,557 B2 * | 10/2010 | Honda et al. | ................. | 438/775 |
| 7,825,018 B2 * | 11/2010 | Sasaki | .......................... | 438/594 |
| 7,850,778 B2 * | 12/2010 | Lemaire | ...................... | 118/715 |
| 7,857,984 B2 * | 12/2010 | Takahashi | ...................... | 216/67 |
| 7,901,510 B2 * | 3/2011 | Horimizu | ...................... | 118/715 |
| 7,988,062 B2 * | 8/2011 | Nonaka et al. | ................ | 236/1 C |
| 8,006,640 B2 * | 8/2011 | Sasaki | .................... | 118/723 AN |
| 8,038,833 B2 * | 10/2011 | Maebashi et al. | ........ | 156/345.28 |
| 8,083,891 B2 * | 12/2011 | Sato | ........................... | 156/345.47 |
| 8,118,938 B2 * | 2/2012 | Carducci et al. | ............. | 118/715 |
| 8,282,736 B2 * | 10/2012 | Carducci et al. | ............. | 118/715 |
| 8,287,689 B2 * | 10/2012 | Sato | ........................ | 156/345.28 |
| 8,313,578 B2 * | 11/2012 | Carducci et al. | ............. | 118/715 |
| 8,383,000 B2 * | 2/2013 | Tsujimoto et al. | .............. | 216/59 |
| 8,389,420 B2 * | 3/2013 | Kabe et al. | .................... | 438/771 |
| 8,449,715 B2 * | 5/2013 | Mitsuhashi et al. | ..... | 156/345.34 |
| 8,568,554 B2 * | 10/2013 | Hayashi | .................... | 156/345.33 |
| 8,623,172 B2 * | 1/2014 | Hayashi | .................... | 156/345.33 |
| 2003/0042227 A1 * | 3/2003 | Fink | ............................. | 216/63 |
| 2004/0050496 A1 * | 3/2004 | Iwai et al. | ................. | 156/345.51 |
| 2004/0108068 A1 * | 6/2004 | Senzaki et al. | ........... | 156/345.43 |
| 2004/0134611 A1 * | 7/2004 | Kato et al. | ............... | 156/345.33 |
| 2004/0140054 A1 * | 7/2004 | Johnson | .................... | 156/345.43 |
| 2004/0182515 A1 * | 9/2004 | Sato | ........................ | 156/345.43 |
| 2004/0261712 A1 * | 12/2004 | Hayashi et al. | ............ | 118/723 E |
| 2005/0056217 A1 * | 3/2005 | Yamada et al. | ................ | 118/715 |
| 2006/0000552 A1 * | 1/2006 | Tanaka et al. | ............ | 156/345.28 |
| 2006/0118042 A1 * | 6/2006 | Horimizu | ...................... | 118/720 |
| 2006/0269694 A1 * | 11/2006 | Honda et al. | ................... | 427/569 |
| 2007/0221130 A1 | 9/2007 | Nozawa et al. | | |
| 2007/0284043 A1 * | 12/2007 | Tanaka et al. | ............ | 156/345.28 |
| 2008/0135177 A1 * | 6/2008 | Kim | ........................ | 156/345.43 |
| 2008/0182412 A1 * | 7/2008 | Bailey, III et al. | ............ | 438/689 |
| 2008/0202689 A1 * | 8/2008 | Kim | ........................ | 156/345.43 |
| 2008/0261074 A1 * | 10/2008 | Shishikura | ..................... | 428/687 |
| 2009/0236043 A1 * | 9/2009 | Matsudo et al. | ......... | 156/345.43 |
| 2009/0255631 A1 * | 10/2009 | Sato | ........................ | 156/345.43 |
| 2010/0192354 A1 * | 8/2010 | Horimizu | ................... | 29/525.12 |
| 2010/0239756 A1 * | 9/2010 | Yamashita | ................. | 427/248.1 |
| 2010/0243166 A1 * | 9/2010 | Hayashi | .................... | 156/345.34 |
| 2010/0243167 A1 * | 9/2010 | Hayashi | .................... | 156/345.43 |
| 2011/0030898 A1 * | 2/2011 | Sato | ........................ | 156/345.24 |
| 2011/0049100 A1 * | 3/2011 | Han et al. | ........................ | 216/67 |
| 2011/0200749 A1 * | 8/2011 | Suzuki et al. | .............. | 427/255.5 |
| 2011/0220609 A1 * | 9/2011 | Yaegashi et al. | ................. | 216/12 |
| 2011/0240224 A1 * | 10/2011 | Yoshimura et al. | ...... | 156/345.47 |
| 2011/0290419 A1 * | 12/2011 | Horiguchi et al. | ........ | 156/345.29 |

FOREIGN PATENT DOCUMENTS

| | | |
|---|---|---|
| JP | 03-145124 A | 6/1991 |
| JP | 08-199364 A | 8/1996 |
| JP | 10-302998 A | 11/1998 |
| JP | 2003-243379 A | 8/2003 |
| JP | 2005-093843 A | 4/2005 |

* cited by examiner

PLASMA PROCESSING APPARATUS

CROSS-REFERENCE TO RELATED APPLICATION

This application claims the benefit of Japanese Patent Application No. 2010-119547 filed on May 25, 2010 and U.S. Provisional Application Ser. No. 61/354,281 filed on Jun. 14, 2010, the entire disclosures of which are incorporated herein by reference.

FIELD OF THE INVENTION

The present disclosure relates to a plasma processing apparatus including an upper electrode capable of vertically moving within a processing chamber.

BACKGROUND OF THE INVENTION

As for a plasma processing apparatus for manufacturing a semiconductor device, there is widely used a so-called parallel plate type plasma processing apparatus which includes a lower electrode for mounting thereon a substrate such as a semiconductor wafer, a liquid crystal substrate or the like; and an upper electrode disposed to face the lower electrode in a processing chamber. In this plasma processing apparatus, the substrate is mounted on the lower electrode, a processing gas is introduced toward the lower electrode through a multiple number of discharge holes formed in the upper electrode, and then plasma of the processing gas is generated by applying a high frequency power between the electrodes. Accordingly, a plasma process such as an etching process or a film formation process is performed on the substrate.

In this parallel plate type plasma processing apparatus, a distance between the upper electrode and the lower electrode may affect plasma processing characteristics on the substrate. Therefore, the distance needs to be accurately adjusted depending on processing conditions or types of plasma processes. Especially, when different types of plasma processes or plasma processes having different processing conditions are continuously performed in the same processing chamber, the distance needs to be adjusted to an optimal distance for each of the plasma processes. For this reason, conventionally, there has been developed a plasma processing apparatus capable of optimally adjusting a distance between an upper electrode and a lower electrode by vertically moving the upper electrode (see, e.g., Patent Document 1).

The plasma processing apparatus described in Patent Document 1 is configured to vertically move the upper electrode between a ceiling wall of a processing chamber and the lower electrode by installing the upper electrode at the ceiling wall of the processing chamber via a bellows. With this configuration, the distance between the upper electrode and the lower electrode (distance between electrodes) can be adjusted by vertically moving the upper electrode.

Patent Document 1: Japanese Patent Laid-open Publication No. 2005-93843

However, in the above-described conventional plasma processing apparatus, since the bellows is installed above the upper electrode, a gap of a certain height exists even when the bellows is contracted. Therefore, a space (space above the upper electrode) between the ceiling wall and the upper electrode is formed within the processing chamber. As a consequence, a processing gas supplied into the processing chamber may also be introduced in this space through a gap between a side surface of the upper electrode and an inner wall of the processing chamber and remain therein.

The processing gas introduced in this space may be hardly exhausted even by driving a vacuum pump. By way of example, when the upper electrode is moved vertically or when an internal pressure of the processing chamber is controlled for a next plasma process, the processing gas remaining in this space may flow downward toward a processing space below the upper electrode. This may affect plasma processing characteristics. Further, when the processing gas is introduced into the space above the upper electrode, a pressure may be increased. Hence, abnormal electric discharge may occur in the space when a high frequency power is applied between the electrodes.

BRIEF SUMMARY OF THE INVENTION

In view of the foregoing, the present disclosure provides a plasma processing apparatus capable of easily exhausting a processing gas introduced in a space above a vertically movable upper electrode, thereby preventing abnormal electrical discharge from occurring in the space above the upper electrode.

In accordance with one aspect of the present disclosure, there is provided a plasma processing apparatus for performing a plasma process on a substrate in a processing chamber. The plasma processing apparatus includes a lower electrode installed at a bottom wall of the processing chamber and configured to mount thereon the substrate; an upper electrode installed so as to face the lower electrode and having a plurality of discharge holes for introducing a processing gas toward the substrate; a power supply unit configured to supply a high frequency power for generating plasma of the processing gas between the electrodes; an elevation unit installed at a ceiling wall of the processing chamber and configured to elevate the upper electrode between the ceiling wall and the lower electrode; a cylindrical wall configured to surround the electrodes and a processing space between the electrodes; an inner gas exhaust path formed at the inside of the cylindrical wall and configured to exhaust an atmosphere in the processing space; and an outer gas exhaust path formed at the outside of the cylindrical wall and configured to exhaust the processing gas introduced into a space between the upper electrode and the ceiling wall.

In accordance with the present disclosure, even if the processing gas supplied into the processing space inside the cylindrical wall is introduced in the space (space above the upper electrode) between the ceiling wall and the upper electrode from the gap between the upper electrode and the cylindrical wall, the processing can be easily exhausted through a gas exhaust port via the outer gas exhaust path. Further, a pressure in the space above the upper electrode can be maintained at a low level, so that abnormal electrical discharge can be prevented from occurring in the space.

Here, the cylindrical wall may be a shield sidewall provided at the inside of a sidewall of the processing chamber, and the outer gas exhaust path may include a gas exhaust space formed between the sidewall of the processing chamber and the shield sidewall. By forming the outer gas exhaust path with the shield sidewall, the processing gas introduced into the space above the upper electrode can be effectively exhausted.

Further, a flange protruded so as to block the outer gas exhaust path may be secured to an upper portion of the shield sidewall, and the flange may be provided with a plurality of communicating holes that allows the outer gas exhaust path to communicate with the space between the upper electrode and the ceiling wall. A conductance of the outer gas exhaust path may be adjusted by changing the number or the shape of the communication holes. With this configuration, a difference between the conductance of the outer gas exhaust path and a conductance of the gap between the upper electrode and the cylindrical wall can be increased. Accordingly, exhaust efficiency of the processing gas introduced into the space between the ceiling wall and the upper electrode can be improved.

Furthermore, a groove may be formed in the flange along a periphery of the shield sidewall, and the communication holes may be formed in a bottom of the groove. Moreover, a plurality of communication holes may be formed in the shield sidewall so as to allow a space in the groove to communicate with a gap between the upper electrode and the shield sidewall. With this configuration, the processing gas introduced into the gap between the upper electrode and the shield sidewall can flow to the gas exhaust port through the communication holes and the outer gas exhaust path. Accordingly, the processing gas can be prevented from entering the space above the upper electrode.

Moreover, the cylindrical wall may be the sidewall of the processing chamber, and the outer gas exhaust path may be a bypass line that allows the space between the upper electrode and the ceiling wall to communicate with a gas exhaust line connected to a gas exhaust port of the processing chamber. Accordingly, the present disclosure is applicable to a plasma processing apparatus in which the shield sidewall is not installed.

In accordance with the present disclosure, even if the processing gas is introduced into the space above the movable upper electrode, the processing gas can be easily exhausted through the outer gas exhaust path and an abnormal electrical discharge can be prevented from occurring in the space.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
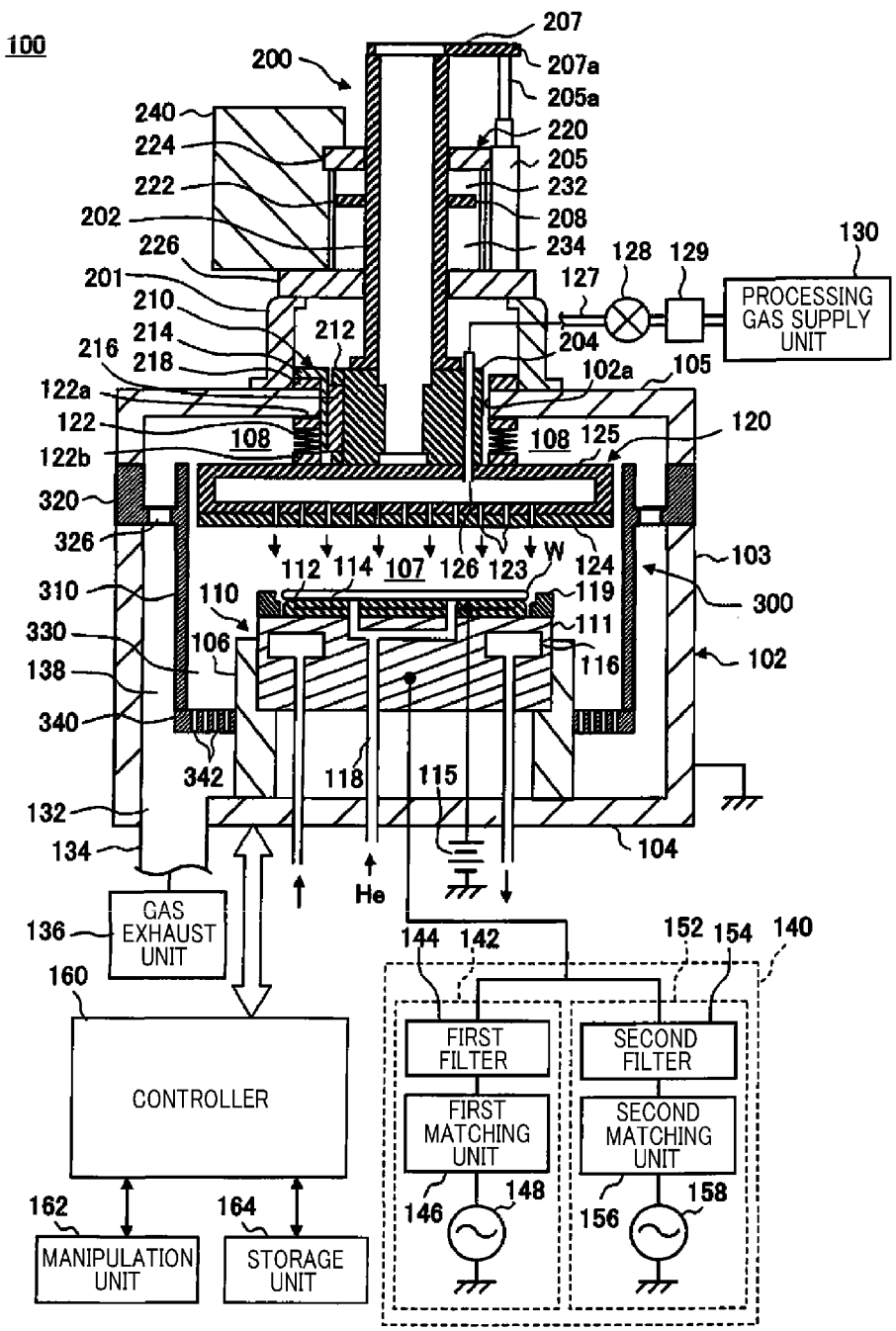
FIG. 1 is a cross sectional view showing a schematic configuration of a plasma processing apparatus in accordance with an embodiment of the present disclosure.

Hereinafter, the embodiments of the present disclosure will be described in detail with reference to the accompanying drawings. Through the present specification and drawings, parts having substantially the same function and configuration will be assigned same reference numerals, and redundant description will be omitted.

FIG. 1 shows a schematic configuration of a parallel plate type plasma processing apparatus 100 as an example of a plasma processing apparatus in accordance with an embodiment of the present disclosure. The plasma processing apparatus 100 may include a cylindrical processing chamber 102 made of, e.g., aluminum whose surface is anodically oxidized (alumite treated). The processing chamber 102 is electrically grounded. The processing chamber 102 may have, by way of example, a processing vessel surrounded by a cylindrical sidewall 103, a bottom wall 104 and a ceiling wall 105. The ceiling wall 105 is detachably fixed to an upper portion of the sidewall 103.

Provided within the processing chamber 102 are a lower electrode (susceptor) 111 serving as a part of a mounting table 110 for mounting thereon a wafer W and an upper electrode 120 installed so as to face the lower electrode 111 and serving as a shower head for introducing a processing gas, a purge gas or the like.

The lower electrode 111 is made of, e.g., aluminum and is installed at the bottom wall 104 of the processing chamber 102 via a cylindrical insulating support 106. Further, the lower electrode 111 is formed in a columnar shape so as to correspond to an outer diameter of the wafer W.

Installed on a top surface of the lower electrode 111 is an electrostatic chuck 112 for holding the wafer W by an electrostatic attracting force. The electrostatic chuck 112 has an electrostatic chuck electrode 114 made of, e.g., a conductive film embedded in an insulating film. A DC power supply 115 is electrically connected to the electrostatic chuck electrode 114. With this configuration of the electrostatic chuck 112, the wafer W can be attracted to and held on the electrostatic chuck 112 by a Coulomb force generated by a DC voltage from the DC power supply 115.

A cooling unit is installed within the lower electrode 111. By way of example, the cooling unit is configured to circulate and supply a coolant (for example, cooling water) of a predetermined temperature to a coolant path 116 extended along a circumference within the lower electrode 111 from a non-illustrated chiller unit through a coolant line. A processing temperature of the wafer W on the electrostatic chuck 112 can be controlled by adjusting the temperature of the coolant.

In the lower electrode 11 and the electrostatic chuck 112, a heat transfer gas supply line 118 is provided toward a rear surface of the wafer W. A heat transfer gas (a backgas) such as a He gas is introduced through the heat transfer gas supply line 118 and supplied between a top surface of the electrostatic chuck 112 and the rear surface of the wafer W. Accordingly, a heat transfer between the lower electrode 111 and the wafer W is accelerated. A focus ring 119 is installed so as to surround the wafer W mounted on the electrostatic chuck 112. The focus ring 119 is made of, e.g., quartz or silicon and installed on the top surface of the lower electrode 111.

The upper electrode 120 is supported at the ceiling wall 105 of the processing chamber 102 so as to be elevatable by an upper electrode elevation unit 200. Accordingly, a distance between the lower electrode 111 and the upper electrode 120 can be adjusted. The upper electrode elevation unit 200 will be described in detail later.

The upper electrode 120 is supported at the ceiling wall 105 of the processing chamber 102 via a bellows 122. The bellows 122 is fixed to a bottom surface of an outer part of an opening 102a formed in the ceiling wall 105 of the processing chamber 102 by a fixing member such as a bolt via a flange 122a. Further, the bellows 122 is fixed to a top surface of the upper electrode 120 by a fixing member such as a bolt via a flange 122b.

The upper electrode 120 may include an electrode plate 124 serving as a facing surface to the lower electrode 111 and having a multiple number of discharge holes 123; and an electrode support 125 for supporting the electrode plate 124. The electrode plate 124 is made of, e.g., quartz and the electrode support 125 is made of, e.g., a conductive material such as aluminum whose surface is alumite treated.

The electrode support 125 of the upper electrode 120 has a gas inlet opening 126. A gas supply line 127 is connected to the gas inlet opening 126. Further, a processing gas supply unit 130 is connected to the gas supply line 127 via a valve 128 and a mass flow controller 129.

By way of example, an etching gas for a plasma etching process is supplied from the processing gas supply unit 130. Although one processing gas supply system including the gas supply line 127, the valve 128, the mass flow controller 129 and the processing gas supply unit 130 is illustrated in FIG. 1, the plasma processing apparatus 100 may have a multiple number of processing gas supply systems. By way of example, processing gases such as $CHF_3$, Ar and He are supplied into the processing chamber 102 while flow rates thereof are independently controlled.

Hereinafter, a configuration example of an upper electrode elevation unit 200 will be described with reference to FIG. 1. The configuration of the upper electrode elevation unit 200 is not limited to that shown in FIG. 1. The upper electrode elevation unit 200 of FIG. 1 may include a substantially cylindrical sliding support member 204 for supporting and slidably moving the upper electrode 120 within the processing chamber 102. The sliding support member 204 is installed substantially at a center of the upper portion of the upper electrode 120 by bolts or the like.

The sliding support member 204 is installed such that the sliding support member 204 can be inserted into and retracted from the opening 102a formed substantially at a center of the ceiling wall of the processing chamber 102. Specifically, an outer peripheral surface of the sliding support member 204 is supported at a sidewall surface of the opening 102a of the processing chamber 102 so as to be slidable via a slide unit 210.

The slide unit 210 may include a guide member 216 fixed to a vertical portion of a fixing member 214 installed at an upper portion of the processing chamber 102 and having an L-shaped cross section; and a rail member 212 slidably supported by the guide member 216 and formed in one direction (vertical direction in the present embodiment) on the outer peripheral surface of the sliding support member 204.

A horizontal portion of the fixing member 214 for fixing the guide member 216 of the slide unit 210 is fixed to the upper portion of the processing chamber 102 via an annular horizontality adjustment plate 218. The horizontality adjustment plate 218 is configured to adjust a horizontal position of the upper electrode 120. By way of example, the horizontality adjustment plate 218 may be fixed to the processing chamber 102 by a multiple number of bolts spaced apart from each other at a regular interval along a periphery of the horizontality adjustment plate 218, and an inclination of the horizontality adjustment plate 218 with respect to a horizontal plane can be varied by adjusting a protruding degree of the bolts. By adjusting the inclination of the horizontality adjustment plate 218 with respect to the horizontal plane, an inclination of the guide member 216 of the slide unit 210 with respect to a vertical plane can be adjusted. Since the upper electrode 120 is supported via the guide member 216, an inclination of the upper electrode 120 with respect to the horizontal plane can be adjusted resultantly. In this way, the horizontality of the upper electrode 120 can be adjusted by a simple manipulation.

An air pressure cylinder 220 for moving the upper electrode 120 is installed above the processing chamber 102 via a cylindrical body 201. That is, a lower end of the cylindrical body 201 is airtightly mounted so as to cover the opening 102a of the processing chamber 102 by bolts or the like, and an upper end of the cylindrical body 201 is airtightly secured at a lower end of the air pressure cylinder 220.

The air pressure cylinder 220 has a rod 202 capable of moving in one direction, and a lower end of the rod 202 is connected to a substantially upper central portion of the sliding support member 204 by bolts or the like. With this configuration, by moving the rod 202 of the air pressure cylinder 220, the upper electrode 120 is moved in one direction along the slide unit by the sliding support member 204. The rod 202 is formed in a cylindrical shape, and an inner space of the rod 202 communicates with a central hole formed substantially at a center of the sliding support member 204 and opens to the atmosphere. Accordingly, wiring such as a grounding wire (not shown in FIG. 1) can be connected to the upper electrode 120 through the inner space of the rod 202 and the central hole of the sliding support member 204.

In addition, a linear encoder 205 serving as a position detecting device for detecting a position of the upper electrode 120 is installed at a side of the air pressure cylinder 220. Meanwhile, an upper member 207 having a protrusion 207a extending sideward from the rod 202 is mounted on an upper end of the rod 202 of the air pressure cylinder 220, and a detection member 205a of the linear encoder 205 is in contact with the protrusion 207a of the upper member 207. Since the upper member 207 is coupled with the upper electrode 120, the position of the upper electrode 120 can be detected by the linear encoder 205.

The air pressure cylinder 220 may include a cylinder main body 222 interposed between an upper support plate 224 and a lower support plate 226. Attached to an outer peripheral surface of the rod 202 is an annular partition member 208 for partitioning the inside of the air pressure cylinder 220 into a first cylinder space 232 and a second cylinder space 234.

Compressed air is introduced into the first space 232 of the air pressure cylinder 220 through a non-illustrated upper port. Further, compressed air is introduced into the second space 234 of the air pressure cylinder 220 through a non-illustrated lower port. By controlling the amount of the air introduced into the first cylinder space 232 and the second cylinder space 234, the rod 202 can be moved in one direction (here, in the vertical direction). The amount of the air introduced into the air pressure cylinder 220 is controlled by an air pressure circuit 240 installed near the air pressure cylinder 220. Although the embodiment has been described for the case of using the air pressure cylinder 220 as an actuator for vertically moving the upper electrode 120, the present disclosure is not limited thereto.

A power supply unit 140 for supplying dual frequency powers is connected to the lower electrode 111. The power supply unit 140 may include a first high frequency power supply unit 142 for supplying a first high frequency power (high frequency power for plasma excitation) of a first frequency; and a second high frequency power supply unit 152 for supplying a second high frequency power (high frequency power for bias voltage generation) of a second frequency lower than the first frequency.

The first high frequency power supply unit 142 may include a first filter 144, a first matching unit 146 and a first power supply 148 connected in sequence from the lower electrode 111. The first filter 144 prevents a power component of the second frequency from entering the first matching unit 146. The first matching unit 146 matches a component of the first high frequency power.

The second high frequency power supply unit 152 may include a second filter 154, a second matching unit 156 and a second power supply 158 connected in sequence from the lower electrode 111. The second filter 154 prevents a power component of the first frequency from entering the second matching unit 156. The second matching unit 156 matches a component of the second high frequency power.

A controller (overall control unit) 160 is connected to the plasma processing apparatus 100. Each part of the plasma processing apparatus 100 is controlled by the controller 160. Further, the controller 160 is connected to a manipulation unit 162 including a keyboard through which an operator inputs commands to manage the plasma processing apparatus 100 or a display which visually displays an operation status of the plasma processing apparatus 100.

Further, the controller 160 is connected to a storage unit 164 that stores therein: programs for implementing various processes (e.g., etching, asking, or film formation) performed in the plasma processing apparatus 100 under the control of the controller 160; and processing conditions (recipes) required for executing the programs.

By way of example, the storage unit 160 stores a multiple number of processing conditions (recipes). Each processing condition includes a multiple number of parameter values such as control parameters for controlling each part of the plasma processing apparatus 100 and setting parameters. Each processing condition may include parameter values such as a flow rate ratio of the processing gases, a pressure in the processing chamber, a high frequency power, and the like.

Further, the programs or the processing conditions may be stored in a hard disk or a semiconductor memory, or may be set at a predetermined area of the storage unit 164 in the form of a storage medium readable by a potable computer such as a CD-ROM, a DVD, or the like.

The controller 160 reads out a program and processing condition from the storage unit 164 in response to an instruction from the manipulation unit 162 and controls each part, thereby carrying out a desired process in the plasma processing apparatus 100. Further, the processing condition can be edited by the manipulation unit 162.

A gas exhaust port 132 is formed at the bottom wall 104 of the processing chamber 102. A gas exhaust unit 136 is connected to the gas exhaust port 132 via a gas exhaust line 134. The gas exhaust unit 136 includes, e.g., a vacuum pump and is capable of depressurizing the inside of the processing chamber 102 to a preset vacuum degree. Further, although not shown, a loading/unloading port for the wafer W and a gate valve for opening/closing the loading/unloading port are provided at the sidewall 103 of the processing chamber 102.

In this plasma processing apparatus 100, a distance between electrodes is adjusted by vertically moving the upper electrode 120. Further, the processing gas is introduced toward a processing space 107 above the lower electrode via the upper electrode 120 from the processing gas supply unit 130, and the first and the second high frequency powers are applied to the lower electrode 111. Accordingly, plasma of the processing gas is generated and a plasma process such as etching or film formation is performed on the wafer W mounted on the mounting table 110.

However, in this plasma processing apparatus 100 having the vertically movable upper electrode 120, since the bellows 122 is mounted on the upper electrode 120 (on the electrode support 125), a gap of a certain height exists even when the bellows 122 is contracted. Accordingly, outside the bellows 122, a space 108 is formed between the ceiling wall 105 and the upper electrode 120 (space between the ceiling wall 105 and the electrode support 125). As a consequence, the processing gas introduced into the space 108 through a gap formed around the side portion of the upper electrode 120 may remain in the space 108. Here, if the gap formed around the upper electrode 120 is small, it is difficult to exhaust the remaining processing gas through the gas exhaust port 132 even by driving the vacuum pump.

Hence, in the present embodiment, a cylindrical wall surrounding the electrodes 111 and 120 and the processing space 107 is formed, and an outer gas exhaust path 138 for directly exhausting the processing gas introduced into the space 108 between the upper electrode 120 and the ceiling wall 105 is formed at the outside of the cylindrical wall. FIG. 1 shows a shield sidewall 310 of a shield member 300 serving as the cylindrical wall surrounding the electrodes 111 and 120 and the processing space 107. Here, the outer gas exhaust path 138 is formed between the shield sidewall 310 and the sidewall 103 of the processing chamber 102 and serves as a gas exhaust space communicating with the gas exhaust port 132.

With this configuration, when the vacuum pump of the gas exhaust unit 136 is driven, the processing gas introduced into the space 108 above the upper electrode 120 is directly exhausted through the gas exhaust port 132 via the outer gas exhaust path 138. By forming the outer gas exhaust path 138 with the shield sidewall 310, the processing gas introduced into the space 108 above the upper electrode 120 can be effectively exhausted.

Figure 2:
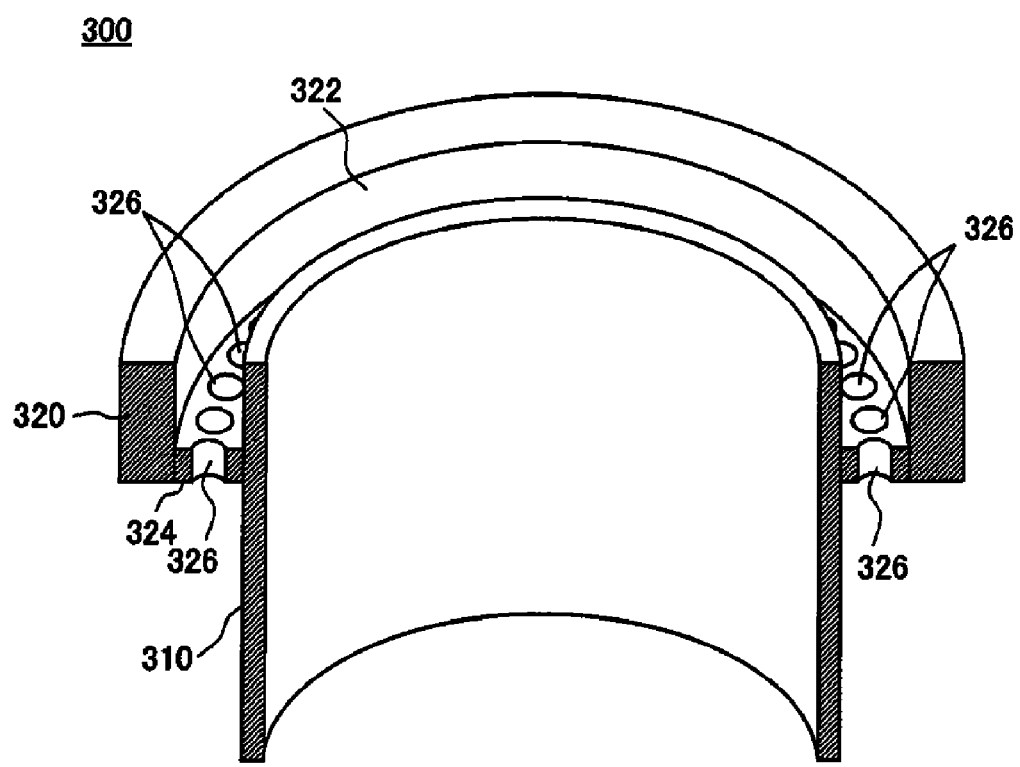
FIG. 2 is a cross sectional perspective view showing a configuration example of a shield member shown in FIG. 1.

The shield member 300 may be configured as shown in FIG. 2, for example. The shield member 300 may include the shield sidewall 310 and a flange 320 attached to an upper portion of the shield sidewall 310. Here, the shield sidewall 310 and the flange 320 may be formed as a single part or as separate parts.

The shield member 300 is supported at an upper portion of the sidewall 103 of the processing chamber 102 by the flange 320. Specifically, the flange 320 is protruded outward from an outer peripheral surface of the shield sidewall 310 so as to block the outer gas exhaust path 138. As shown in FIG. 1, the flange 320 is secured between the sidewall 103 and the ceiling wall 105 by bolts or the like. A sealing member such as a non-illustrated O-ring is provided at the flange 320 in order to maintain airtightness between the flange 320 and the sidewall 103 of the processing chamber 102 and between the flange 320 and the ceiling wall 105 of the processing chamber 102.

As shown in FIG. 2, a groove 322 is formed at the flange 320 along the circumference of the shield sidewall 310. At a bottom 324 of the groove 322, a multiple number of communication holes 326 are formed so as to allow the space 108 above the upper electrode 120 to communicate with the outer gas exhaust path 138. A conductance of the outer gas exhaust path 138 can be adjusted by changing the number or the shape of the communication holes 326. Here, in order to increase exhaust efficiency through the outer gas exhaust path 138, desirably, the conductance of the outer gas exhaust path 138 may be set to be greater than a conductance of a gap between the upper electrode 120 and the shield sidewall 310.

Although the communication hole 326 is described to have a round shape in FIG. 2, the shape of the communication hole 326 is not limited thereto. The communication hole 326 may have another shape such as a slit shape, an elliptical shape or the like. When the communication hole 326 is a slit, the communication hole 326 may extend in a radial direction or in a circumferential direction. In this way, simply by adjusting the number or the shape of the communication holes 326, a difference between the conductance of the outer gas exhaust path 138 and the conductance of the gap between the upper electrode 120 and the shield sidewall 310 can be increased. Accordingly, the processing gas introduced into the space 108 above the upper electrode 120 can be exhausted more effectively.

An inner gas exhaust path 330 communicating with the gas exhaust port 132 is formed inside the shield sidewall 310, i.e., between the shield sidewall 310 and the cylindrical support 106. A baffle plate 340 is secured between the inner gas exhaust path 330 and the gas exhaust port 132. Specifically, by way of example, the baffle plate 340 is attached to a lower end of the shield sidewall 310 so as to surround the cylindrical support 106, as can be seen from FIG. 1. A multiple number of through holes 342 are formed in the baffle plate 340. Hence, when the vacuum pump of the gas exhaust unit 136 is driven, the atmosphere in the shield sidewall 310 is exhausted from the gas exhaust port 132 through the inner gas exhaust path 330 and the through holes 342 of the baffle plate 340.

An inner surface of the shield sidewall 310 is anodically oxidized (e.g., alumite treated) and, thus, particles hardly adhere thereto. By surrounding the processing space 107 with this shield sidewall 310, the sidewall 103 of the processing chamber 102 can be protected from particles and the like.

Figure 3:
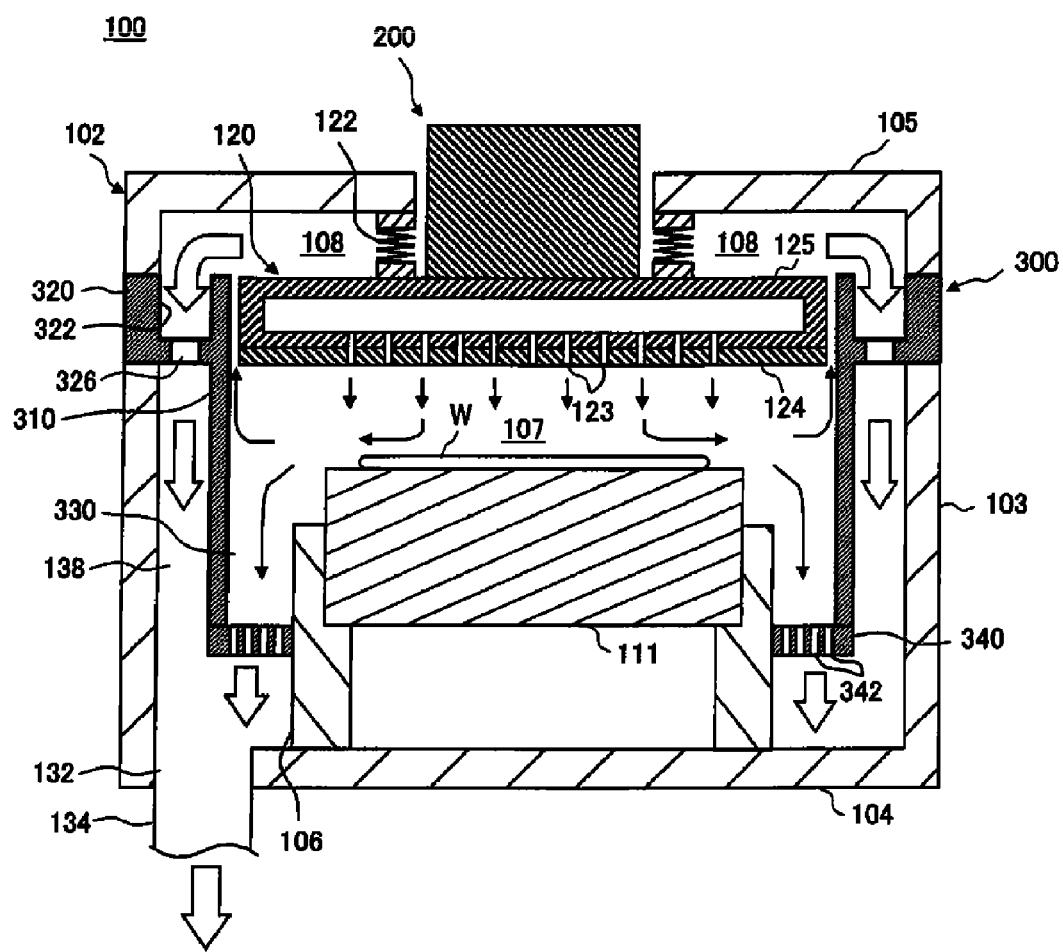
FIG. 3 is a diagram for describing a gas exhaust flow within a processing chamber and is a cross sectional view showing a schematic configuration of the plasma processing apparatus in accordance with the present disclosure.
Figure 4:
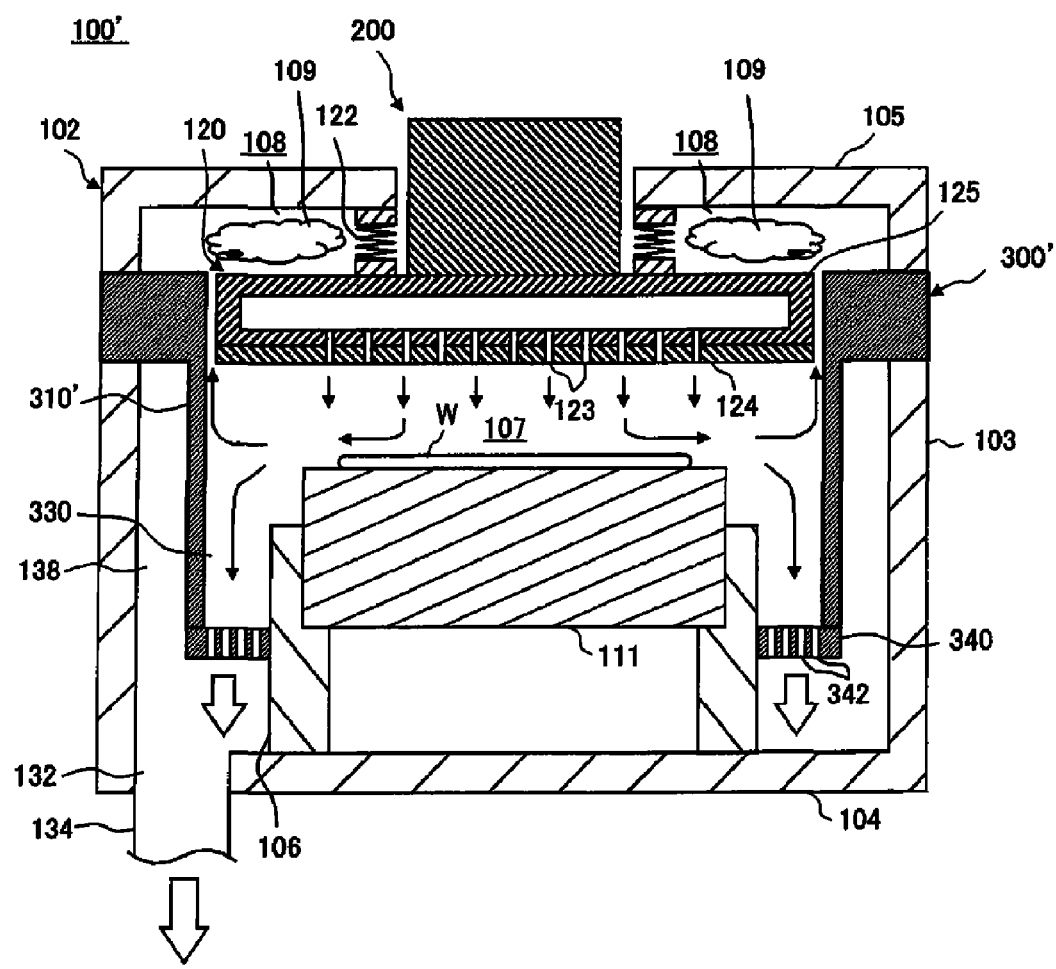
FIG. 4 is a diagram for describing a gas exhaust flow within a processing chamber and is a cross sectional view showing a schematic configuration of a plasma processing apparatus in accordance with a comparative example.

Next, a gas exhaust flow in the plasma processing apparatus 100 will be described with reference to the following drawings. FIG. 3 is a schematic cross sectional view of the plasma processing apparatus 100 in which the shield member 300 forming the outer gas exhaust path 138 is installed. FIG. 4 is a schematic cross sectional view of a plasma processing apparatus 100' in accordance with a comparative example and the plasma processing apparatus 100' in which a shield member 300' without forming an outer gas exhaust path 138 is installed. In FIGS. 3 and 4, the illustration of the configuration of the upper electrode elevation unit 200 and the configuration near the lower electrode 111 is simplified.

In both apparatuses shown in FIGS. 3 and 4, when the vacuum pump of the gas exhaust unit 136 of FIG. 1 is driven, the processing gas is introduced from the upper electrode 120 toward the processing space 107. If the first and second high frequency powers are applied to the lower electrode, plasma of the processing gas is generated and a plasma process is performed on the wafer W.

Here, most of the atmosphere in the shield sidewalls 310 and 310' is exhausted through the gas exhaust port 132 via the inner gas exhaust path 330 and the through holes 342 of the baffle plate 340. Meanwhile, a part of the atmosphere in the sidewalls 310 and 310' is introduced into the space 108 above the upper electrode 120 through the gap formed around the side portion of the upper electrode 120. Therefore, the processing gas 109 is introduced into the space 108 above the upper electrode 120.

In this case, if the outer gas exhaust path 138 is not provided as shown in FIG. 4, it may be extremely difficult to exhaust the processing gas that has been introduced into the space 108 above the upper electrode 120, and the processing gas is highly likely to remain in the space 108. On the contrary, if the outer gas exhaust path 138 is provided as shown in FIG. 3, the processing gas that has been introduced into the space 108 above the upper electrode 120 can be easily exhausted directly from the gas exhaust port 132 through the outer gas exhaust path 138. As a consequence, it is possible to prevent the processing gas from remaining in the space 108 above the upper electrode 120. Besides, a pressure in the space 108 above the upper electrode 120 can be maintained at a low level, so that abnormal electrical discharge can be prevented from occurring in the space 108.

In addition, by adjusting the number or the shape of the communication holes 326 of the shield sidewall 310, the conductance of the outer gas exhaust path 138 can be set to be greater than the conductance of the gap (gap into which the processing gas is introduced) formed around the upper electrode 120. Accordingly, the processing gas that has been introduced into the space 108 above the upper electrode 120 can be more easily exhausted from the gas exhaust port 132.

Figure 5:
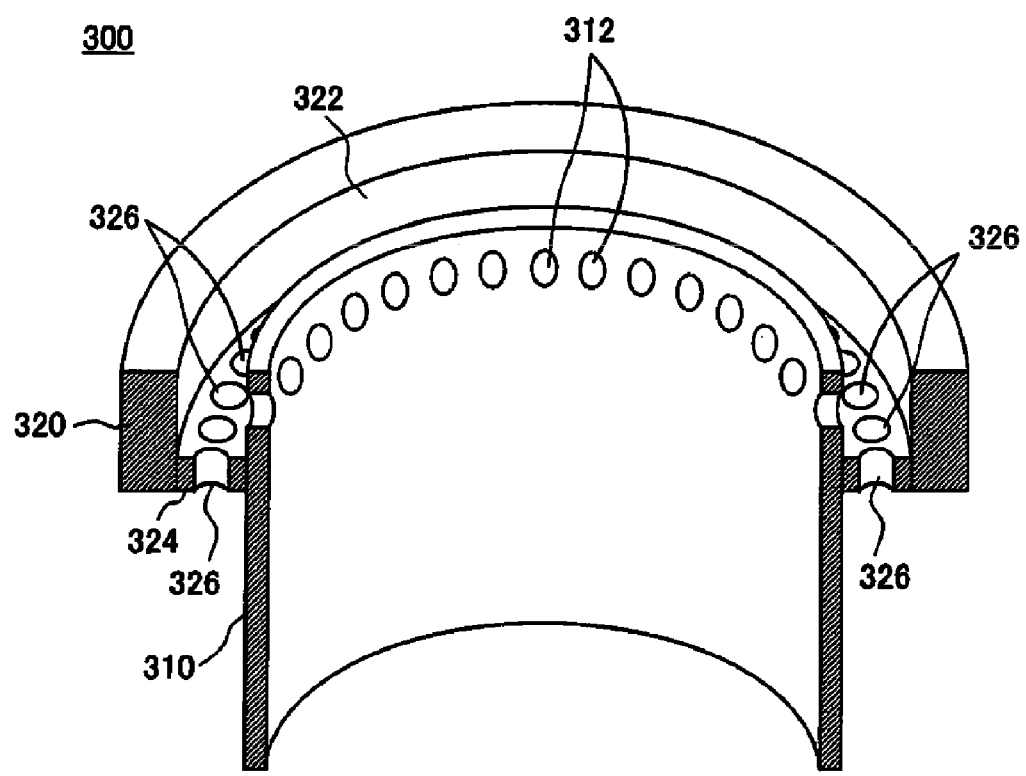
FIG. 5 is a cross sectional perspective view showing a modification example of the shield member in accordance with the present embodiment.
Figure 6:
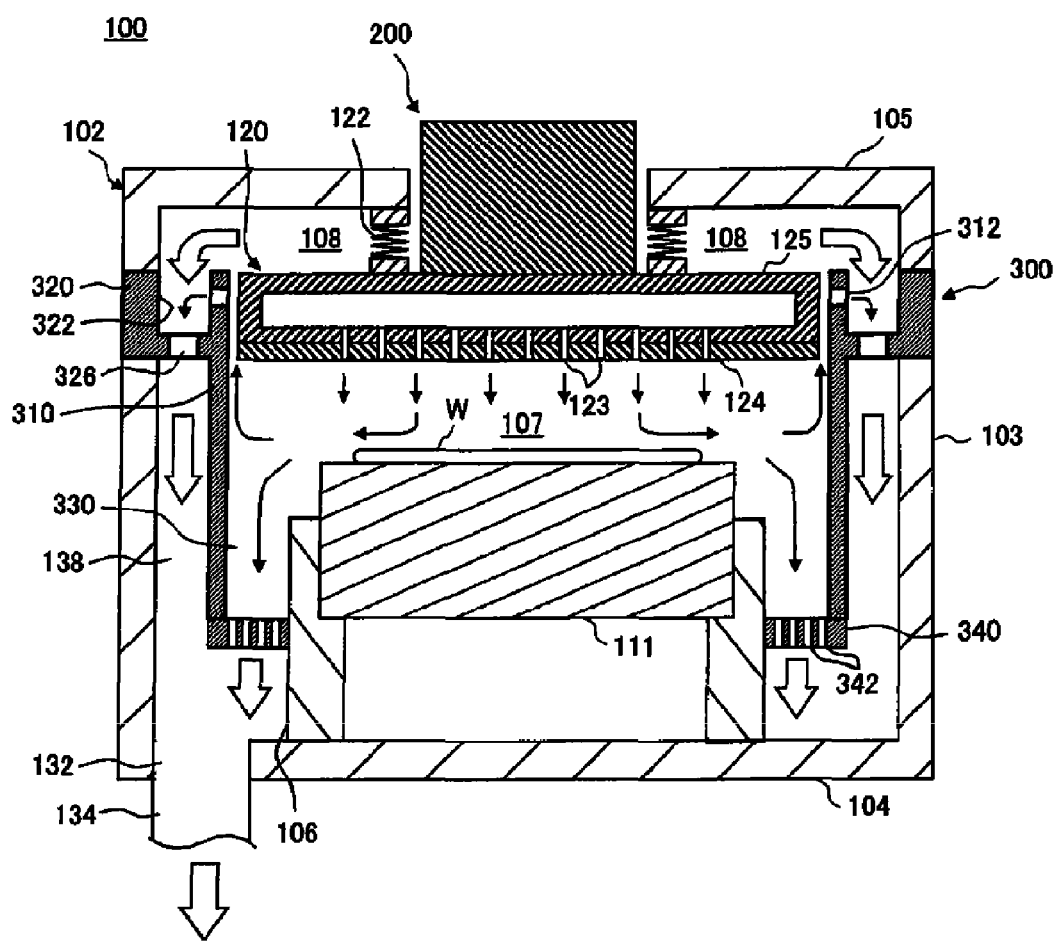
FIG. 6 is a cross sectional view for describing a gas exhaust flow within the processing chamber of the plasma processing apparatus having the shield member shown in FIG. 5.

Further, the configuration of the shield member 300 is not limited to the example shown in FIG. 2. By way of example, as shown in FIG. 5, communication holes 312 may be formed at the shield sidewall 310 so as to allow a space of the groove 322 of the flange 320 to communicate with the gap between the upper electrode 120 and the shield sidewall 310. With this configuration, the processing gas introduced into the gap formed around the upper electrode 120 can also be flown to the outer gas exhaust path 138 through the communication holes 312 and 326, as can be seen from FIG. 6. Accordingly, the processing gas inside the shield sidewall 310 can be prevented from entering the space 108 above the upper electrode 120.

The number or the shape of the communication holes 312 is not limited to the example illustrated in FIG. 5. FIG. 5 shows the communication hole 312 having a round shape. However, the communication hole 312 may have another shape such as a slit shape, an elliptical shape or the like. When the communication hole 312 is formed in a slit shape, the communication hole 312 may extend in a radial direction or in a circumferential direction.

In the above-described embodiment, although the shield sidewall 310 is configured as the cylindrical wall surrounding the electrodes 120 and 111 and the processing space 107 and the outer gas exhaust path 138 is formed between the shield sidewall 310 and the sidewall 103 of the processing chamber 102, the present disclosure is not limited thereto. By way of example, as shown in FIG. 7, the outer gas exhaust path 138 may be implemented by a bypass line that allows the space 108 above the upper electrode 120 to communicate with the gas exhaust line 134 of the processing chamber 102.

Figure 7:
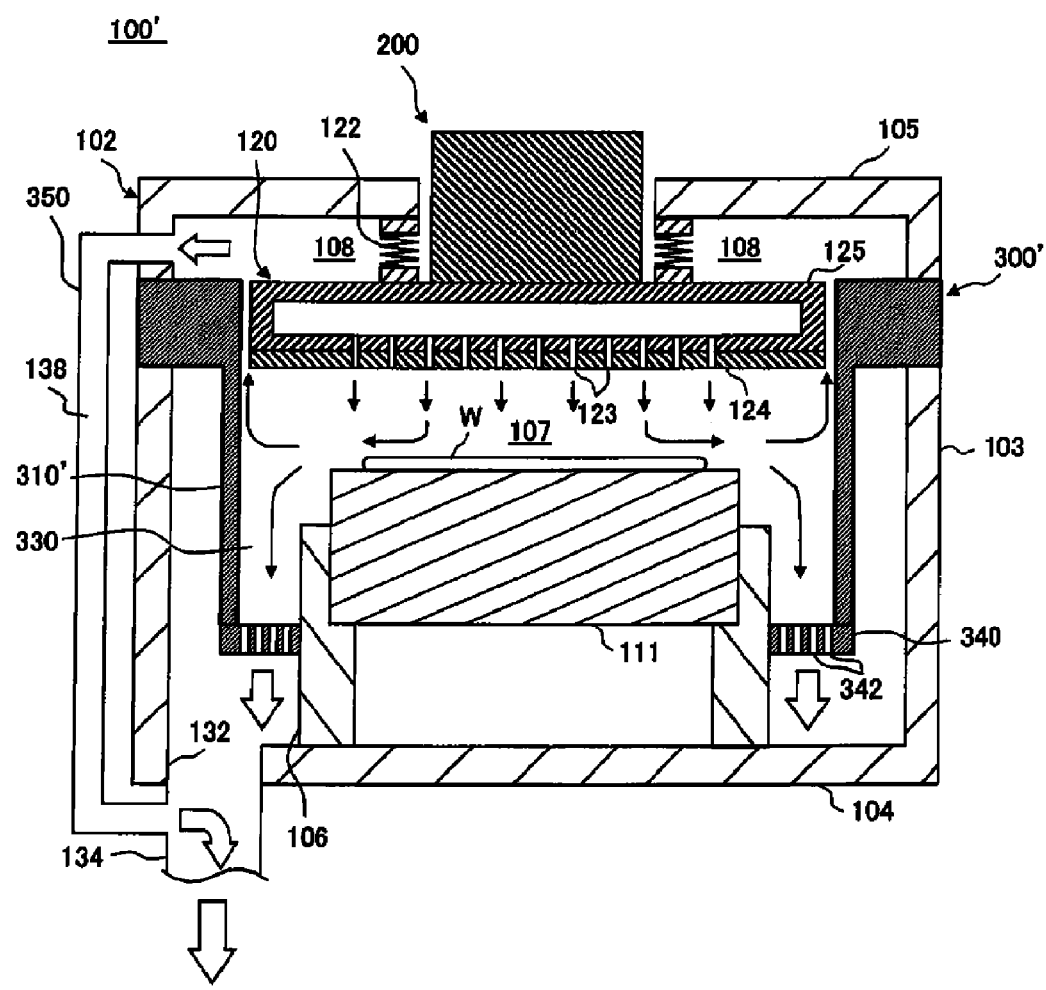
FIG. 7 is a cross sectional view showing a modification example of the plasma processing apparatus in accordance with the present embodiment.

FIG. 7 shows an example configuration in which a bypass line 350 serving as the outer gas exhaust path 138 is installed in the plasma processing apparatus 100' of FIG. 4. In this example, the processing gas introduced in the space 108 above the upper electrode 120 can be easily exhausted directly from the gas exhaust port 132 through the bypass line 350 serving as the outer gas exhaust path 138. With this configuration, it is possible to prevent the processing gas from remaining in the space 108 above the upper electrode 120.

Figure 8:
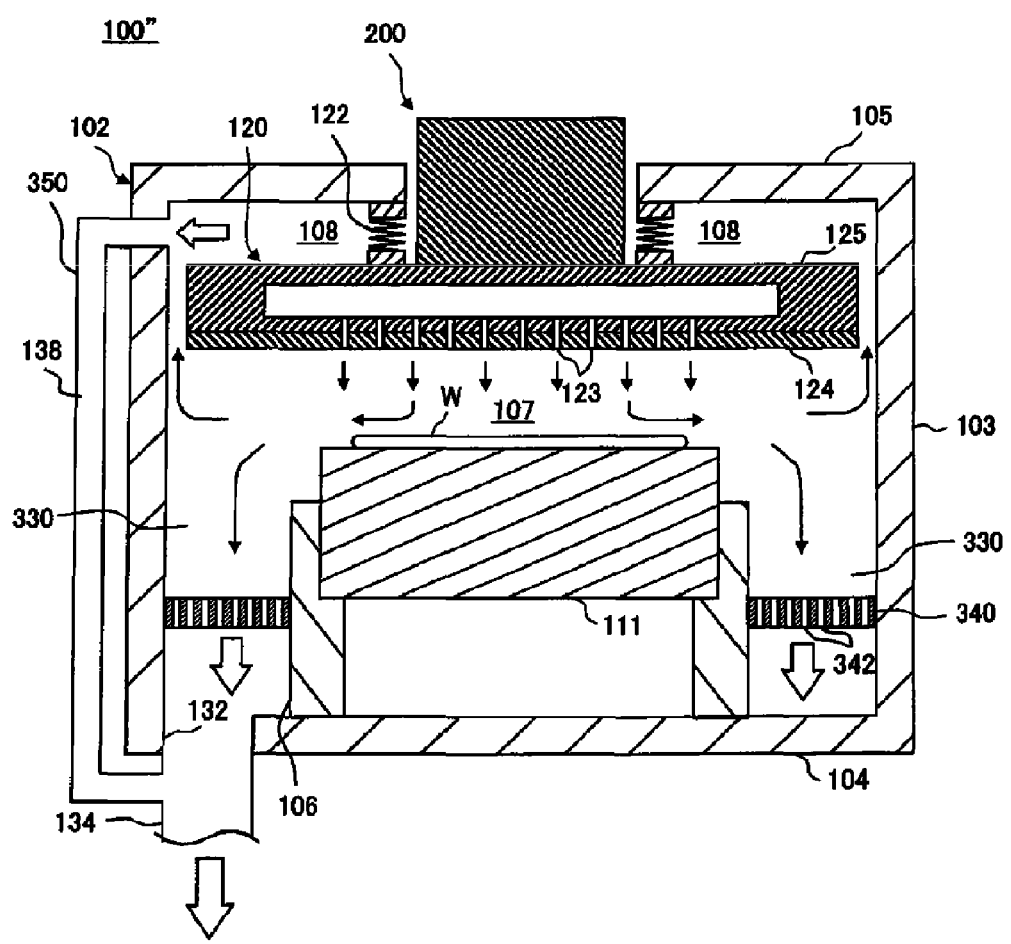
FIG. 8 is a cross sectional view showing another modification example of the plasma processing apparatus in accordance with the present embodiment.

Further, as shown in FIG. 8, it is also possible to use the bypass line 350 serving as the outer exhaust path 138 in a plasma processing apparatus 100" in which the shield sidewall 310 is not installed. In this case, the sidewall 103 of the processing chamber 102 may serve as a cylindrical wall surrounding the electrodes 120 and 111 and the processing space 107. With this configuration, it is possible to prevent the processing gas from remaining in the space 108 above the upper electrode 120.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

Although the embodiment of the present disclosure has been described for the plasma processing apparatus that generates plasma by applying two kinds of high frequency powers to the lower electrode, the present disclosure is not limited thereto. By way of example, the present disclosure is applicable to other types of plasma processing apparatuses such as a type that applies one kind of high frequency power to the lower electrode or a type that applies two kinds of high frequency powers to the upper electrode and the lower electrode respectively.

The present disclosure is applicable to a plasma processing apparatus having a vertically movable upper electrode within a processing chamber.

What is claimed is:

1. A plasma processing apparatus for performing a plasma process on a substrate in a processing chamber, the apparatus comprising:
    a lower electrode installed within the processing chamber and configured to mount thereon the substrate;
    an upper electrode installed so as to face the lower electrode and having a plurality of discharge holes for introducing a processing gas toward the substrate;
    a power supply unit configured to supply a high frequency power for generating plasma of the processing gas between the electrodes;
    an elevation unit installed at a ceiling wall of the processing chamber and configured to elevate the upper electrode between the ceiling wall and the lower electrode;
    a shield sidewall configured to surround the electrodes and a processing space between the electrodes;
    an inner gas exhaust path formed at the inside of the shield sidewall and configured to exhaust an atmosphere in the processing space; and
    an outer gas exhaust path formed at the outside of the shield sidewall and configured to exhaust the processing gas introduced into a space between the upper electrode and the ceiling wall,
    wherein a flange protruded so as to block the outer gas exhaust path is secured to an upper portion of the shield sidewall,
    a groove is formed in the flange between the shield sidewall and a sidewall of the processing chamber,
    a plurality of first communication holes are formed at a bottom of the groove so as to allow the outer gas exhaust path to communicate with the space between the upper electrode and the ceiling wall, and
    a plurality of second communication holes are formed at a sidewall of the groove so as to allow a space in the groove to communicate with a gap between the upper electrode and the shield sidewall.

2. The plasma processing apparatus of claim 1, wherein the shield sidewall is provided at the inside of the sidewall of the processing chamber, and
    the outer gas exhaust path includes a gas exhaust space formed between the sidewall of the processing chamber and the shield sidewall.

* * * * *